(12) United States Patent
Jung

(10) Patent No.: US 7,605,036 B2
(45) Date of Patent: Oct. 20, 2009

(54) METHOD OF FORMING FLOATING GATE ARRAY OF FLASH MEMORY DEVICE

(75) Inventor: Jin Hyo Jung, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 63 days.

(21) Appl. No.: 11/641,791

(22) Filed: Dec. 20, 2006

(65) Prior Publication Data
US 2007/0148872 A1 Jun. 28, 2007

(30) Foreign Application Priority Data
Dec. 22, 2005 (KR) .................. 10-2005-0127920

(51) Int. Cl.
*H01L 21/336* (2006.01)

(52) U.S. Cl. .............. 438/264; 438/142; 438/238; 438/257; 438/258; 438/268; 257/E21.682

(58) Field of Classification Search ............. 438/142
See application file for complete search history.

(56) References Cited

U.S. PATENT DOCUMENTS 6,309,926 B1 * 10/2001 Bell et al. ............. 438/257
6,475,894 B1 * 11/2002 Huang et al. ............. 438/593

* cited by examiner

*Primary Examiner*—N Drew Richards
*Assistant Examiner*—Kyoung Lee
(74) *Attorney, Agent, or Firm*—Lowe Hauptman Ham & Berner, LLP

(57) ABSTRACT

The method of forming a floating gate array of a flash memory device includes: (a) forming a plurality of device isolations, which define active device regions, in a semiconductor substrate, the device isolations being formed such that upper portions thereof protrude from a surface of the substrate by a predetermined height; (b) forming tunnel oxide layers in the active device regions; (c) forming a floating gate-forming layer throughout an entire region of the substrate, including regions in which the plurality of device isolations and the active device regions are formed, the floating gate-forming layer being formed such that grooves are formed along the active device regions; (d) filling the grooves formed on the floating gate-forming layer with masking materials; and (e) patterning the floating gate-forming layer, using the masking materials filling the grooves as an etching mask.

4 Claims, 6 Drawing Sheets

METHOD OF FORMING FLOATING GATE ARRAY OF FLASH MEMORY DEVICE

FIELD OF THE INVENTION

The present invention relates to a technology for manufacturing semiconductor devices and, more particularly, to a method for forming a floating gate array of a flash memory device.

BACKGROUND OF THE INVENTION

A flash memory is a type of Programmable Read Only Memory (PROM) allowing electrical rewriting of data. Flash memory is a device that is designed to perform the programming method of an Erasable PROM (EPROM) and the erase method of an Electrically Erasable PROM (EEPROM) using a single transistor. An EPROM has an advantage in that a memory cell is implemented using a single transistor and thus the cell area is small, but has a disadvantage in that data stored in the EPROM must be simultaneously erased using ultraviolet rays. An EEPROM, however, is electrically erasable, but has a disadvantage in that a memory cell is composed of two transistors, and thus the cell area is large. A flash memory combines the advantages of both the EPROM and the EEPROM.

The exact name of flash memory is flash EEPROM. Since such flash memory retains stored information even when power is turned off, it is called non-volatile memory, and is different from Dynamic Random Access Memory (DRAM) or Static RAM (SRAM) in this regard.

A flash memory can be classified according to the structure of its cell array into a NOR-type flash memory, in which cells are arranged in parallel between a bit line and a ground, and a NAND-type flash memory, in which cells are arranged in series between a bit line and a ground. The NOR-type flash memory, having a parallel structure, is widely used for booting mobile phones because high-speed random access is possible during a read operation. The NAND-type flash memory, having a series structure, is advantageous in that it is generally suitable for storing data because, although the reading speed thereof is low, the writing speed thereof is high, providing profitability through miniaturization.

Furthermore, flash memory can be classified into stacked gate-type flash memory and split gate-type flash memory according to the structure of a unit cell, and can be classified into a floating gate device and a Silicon-Oxide-Nitride-Oxide-Silicon (SONOS) device according to the type of a charge storage layer.

The floating gate device includes a floating gate made of polycrystalline silicon surrounded by a dielectric, and is operated to store or erase data by injecting or discharging charges into, or from, the floating gate through channel hot carrier injection or Fowler-Nordheim (F-N) Tunneling.

FIG. 1A is a sectional view showing a typical NOR-type flash memory device. The section of the device in FIG. 1A represents the vertical section of the flash memory device parallel to a word line. In the conventional flash memory device, a series of device isolations 12, for example, Shallow Trench Isolations (STIs), are formed in a substrate 10 in a direction perpendicular to the word line, thus active device regions are defined. Thereafter, silicon oxide layers 14, used as tunnel oxide layers, are formed in the active device regions of the substrate 10 at a certain thickness, and then a polycrystalline silicon layer, which will be used as a floating gate, is formed. The polycrystalline silicon layer, formed in this way, is patterned through a photo process and an etching process, thus an array of floating gates 16a is formed. In addition, an inter-gate dielectric layer 20 and a control gate 22, made of a polycrystalline silicon layer, are sequentially formed on the floating gates 16a that are spaced apart from each other by a predetermined distance, thus completing a stacked gate.

The above-described conventional process for manufacturing a flash memory device is performed in such a way that, after STIs are formed in the substrate, floating gates are patterned through a separate photo process. In this case, the floating gates and active device regions overlap each other, as shown in region A of FIG. 1A. The reason for this is to secure an overlap margin for the photo process. However, the size of the unit cell increases due to this overlapping region. That is, as shown in FIG. 1B, the overlapping region has an area of about $10.5F^2$ (where F is a one-dimensional unit for comparison). In FIG. 1B, reference numeral 22 denotes a control gate constituting a word line, reference numeral 30 denotes an active device region, and reference numeral 32 denotes a drain contact.

As a method of further reducing the size of a unit cell, a Self-Aligned STI (SA-STI) process has recently been developed. According to this method, a process for forming STI and a process for patterning floating gates can be performed as a single process. That is, after a tunnel oxide layer and a floating gate-forming layer are formed first on a substrate, the floating gate-forming layer, the tunnel oxide layer and part of the substrate are simultaneously etched using a mask oxide layer, thus forming a trench in the substrate. Next, the trench is covered with an oxide layer, and then an STI is formed.

According to this method, since the side walls of a floating gate pattern are aligned with the STI, the area of a unit cell can be reduced. However, the trench in the SA-STI process is formed deeper than the trench in a typical STI process. Accordingly, it is difficult to fill the trench with an oxide, and it is also difficult to apply the SA-STI process to the case where a memory cell and a logic cell are formed together in a single device because the process for forming the trench is different from a typical STI formation process. Furthermore, when a Chemical-Mechanical Polishing (CMP) process is applied after the gap-filling of STI has been terminated the floating gate and the tunnel oxide layer may be damaged. If the CMP process is not applied, it is difficult to perform planarization, thus a problem may occur in a subsequent process.

SUMMARY OF THE INVENTION

It is, therefore, an object of the present invention to provide a method of forming a floating gate array of a flash memory device, which can reduce the area of a unit cell almost as much as a conventional SA-STI process, and can utilize a typical process for manufacturing Complementary Metal Oxide Semiconductor (CMOS) devices without change, thus the forming method can be easily applied even to the manufacture of embedded flash devices.

Furthermore, another object of the present invention is to provide a method of forming a floating gate array, which forms a self-aligned floating gate pattern having higher reliability, through a process simpler than a conventional SA-STI process.

In accordance with a preferred embodiment of the present invention, there is provided a method of forming a floating gate array of a flash memory device, comprising (a) forming a plurality of device isolations, which define active device regions in a semiconductor substrate, the device isolations being formed such that upper portions thereof protrude from a surface of the substrate by a predetermined height; (b)

forming tunnel oxide layers in the active device regions; (c) forming a floating gate-forming layer throughout an entire region of the substrate, including regions in which the plurality of device isolations and the active device regions are formed, the floating gate-forming layer being formed such that grooves are formed along the active device regions; (d) filling the grooves formed on the floating gate-forming layer, with masking materials; and (e) patterning the floating gate-forming layer using the masking materials filling the grooves, as an etching mask.

In accordance with another preferred embodiment of the present invention, there is provided a method of forming a floating gate array of a flash memory device, comprising (a) forming a plurality of device isolations, which define active device regions, in a semiconductor substrate, the device isolations being formed such that upper portions thereof protrude from a surface of the substrate by a predetermined height; (b) forming tunnel oxide layers in the active device regions; (c) forming a floating gate-forming layer throughout an entire region of the substrate, including regions in which the plurality of device isolations and the active device regions are formed, the floating gate-forming layer being formed such that grooves are formed along the active device regions; (d) forming a hard mask layer on the floating gate-forming layer to maintain the grooves which are formed along the active device regions; (e) filling the grooves formed on the hard mask layer with masking materials; (f) patterning the hard mask layer using the masking materials filling the grooves as an etching mask; and (g) patterning the floating gate-forming layer using the patterned hard mask layer as an etching mask.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings so that they can be readily implemented by those skilled in the art.

Embodiment 1

Figure 2A:
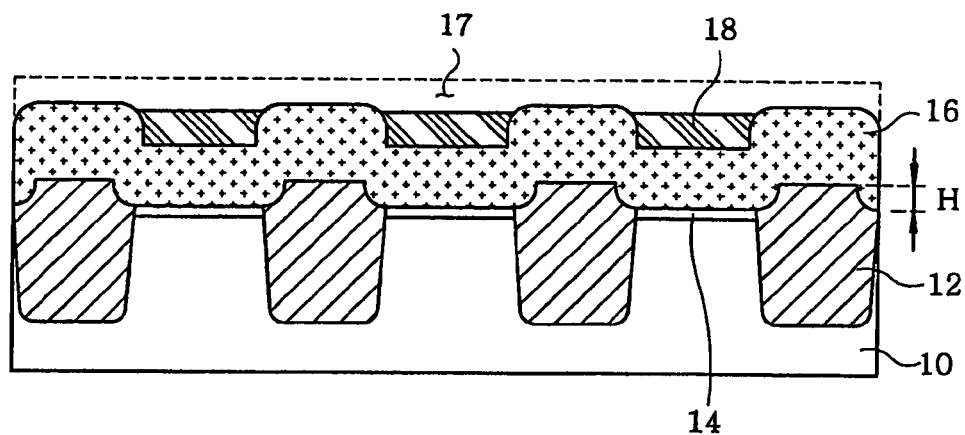
FIGS. 2A to 2C are sectional views sequentially showing a method of forming a floating gate array according to an embodiment of the present invention.
Figure 2B:
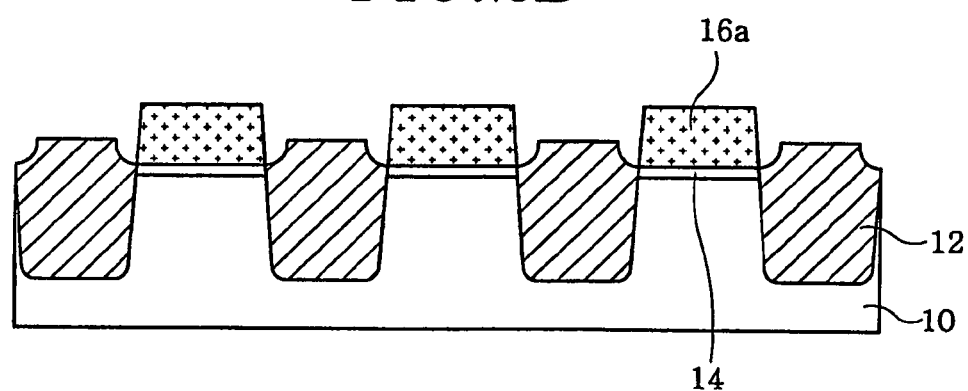
Figure 2C:
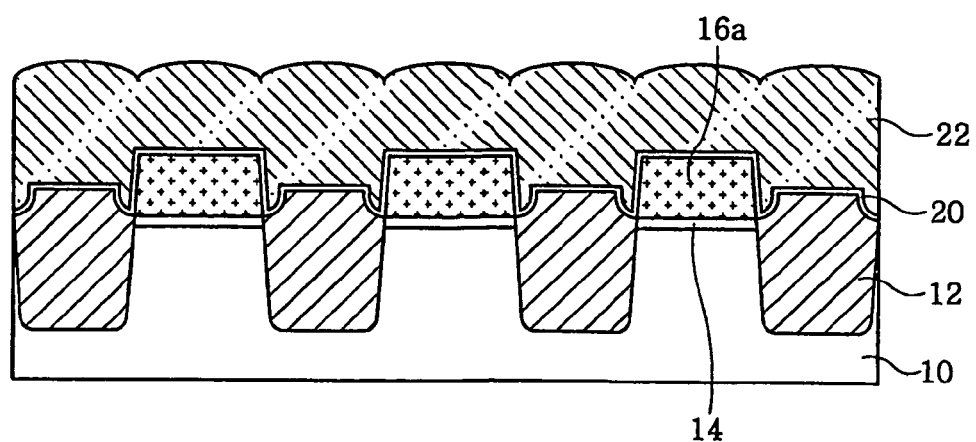

First, with reference to FIGS. 2A to 2C, a first embodiment is described. FIGS. 2A to 2C illustrate the vertical section of a NOR-type flash memory device parallel to a word line.

As shown in FIG. 2A, device isolations 12, such as STIs, are formed in a substrate 10, thus defining active device regions. The device isolations 12 are arranged in a direction perpendicular to a word line, that is, the direction of a bit line. In particular, the device isolations 12 are preferably formed to cause the upper portions thereof to protrude from the surface of the substrate 10 by a predetermined height (H). In the case of STIs, an oxide filling trenches, need only be formed higher than the surface of a substrate.

Thereafter, tunnel oxide layers 14 are formed in the active device regions through silicon thermal oxidation. Subsequently, a floating gate-forming layer 16 is formed throughout the entire region of the substrate 10, including regions in which the device isolations are formed and the active device regions.

For the floating gate-forming layer, polycrystalline silicon, previously doped with impurities, can be used. In particular, since the floating gate-forming layer 16 is formed along the morphology of the substrate 10, floating gate-forming layer 16 has a profile in which portions thereof, formed on the device isolations 12 that are arranged on both sides of each active device region, protrude upwards. That is, portions of the floating gate-forming layer 16 formed on the active device regions, which are relatively low regions, have a depressed shape. Therefore, grooves 17 are formed in the floating gate-forming layer 16 along the active device regions.

Next, masking materials 18 for filling the grooves 17 are applied on the floating gate-forming layer 16. A material used for an anti-reflective layer can be used as the masking materials 18. A photo resist, or Spin On Glass (SOG) oxide may also be used. The process for filling the grooves 17 with the masking materials 18 may be performed in such a way that a masking material is formed sufficiently thick on the floating gate-forming layer 16 and is then planarized through blank etching, which does not require a mask.

Since the masking materials 18 are formed along the grooves 17, the surface of the floating gate-forming layer 16 formed on the device isolations 12 is exposed. Therefore, if an etching process using the masking materials 18 as an etching mask is performed, a portion of the floating gate-forming layer remains only in the active device regions, and the remaining portion of the floating gate-forming layer is removed, as shown in FIG. 2B. The masking materials 18 formed along the grooves 17 have interfaces approximately aligned with those of the device isolations 12. Thus, the side walls of patterned floating gates 16a are aligned with the side walls of the device isolations 12.

Next, as shown in FIG. 2C, an Oxide-Nitride-Oxide (ONO) dielectric layer 20, used as an inter-gate dielectric layer, and a control gate 22 made of polycrystalline silicon are sequentially formed on the floating gates 16a.

Figure 1A:
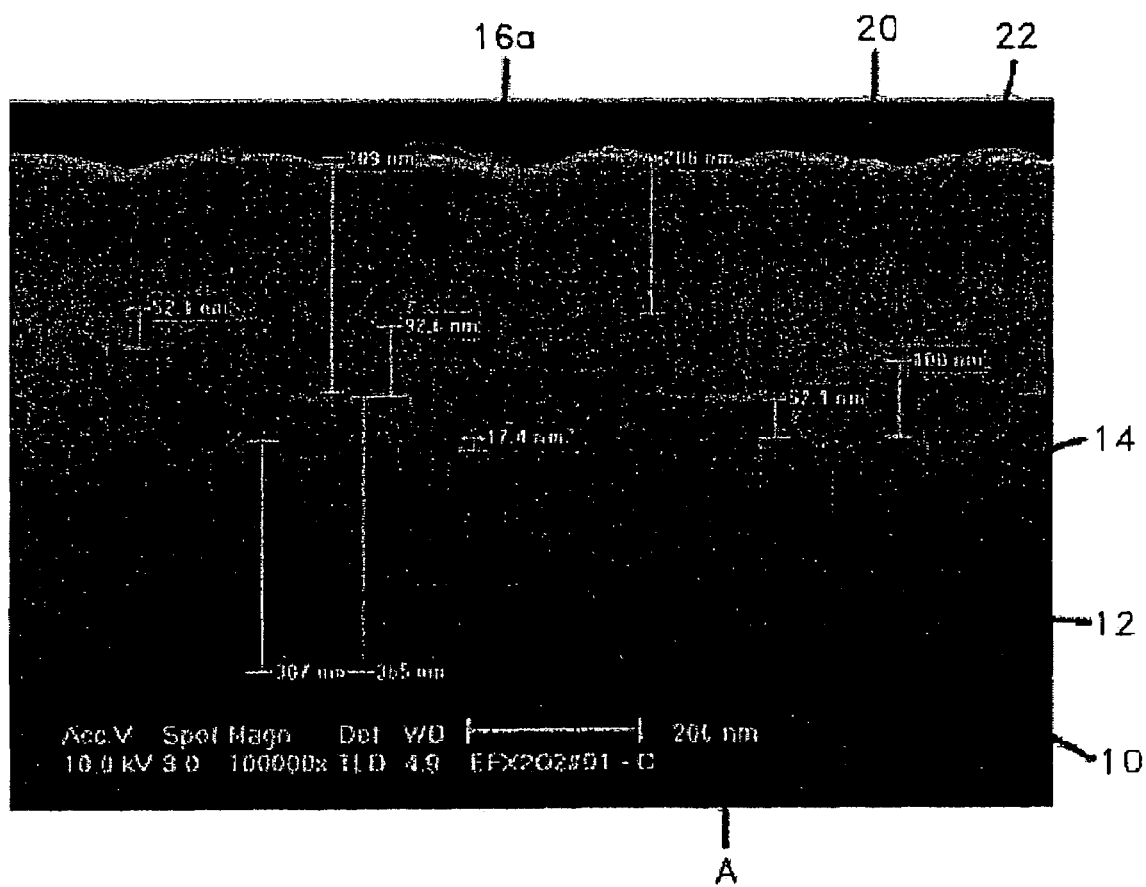
FIG. 1A, obtained using a scanning electron microscopy, is a view showing an image of the shape of the section of a typical flash memory device parallel to a word line.
Figure 1B:
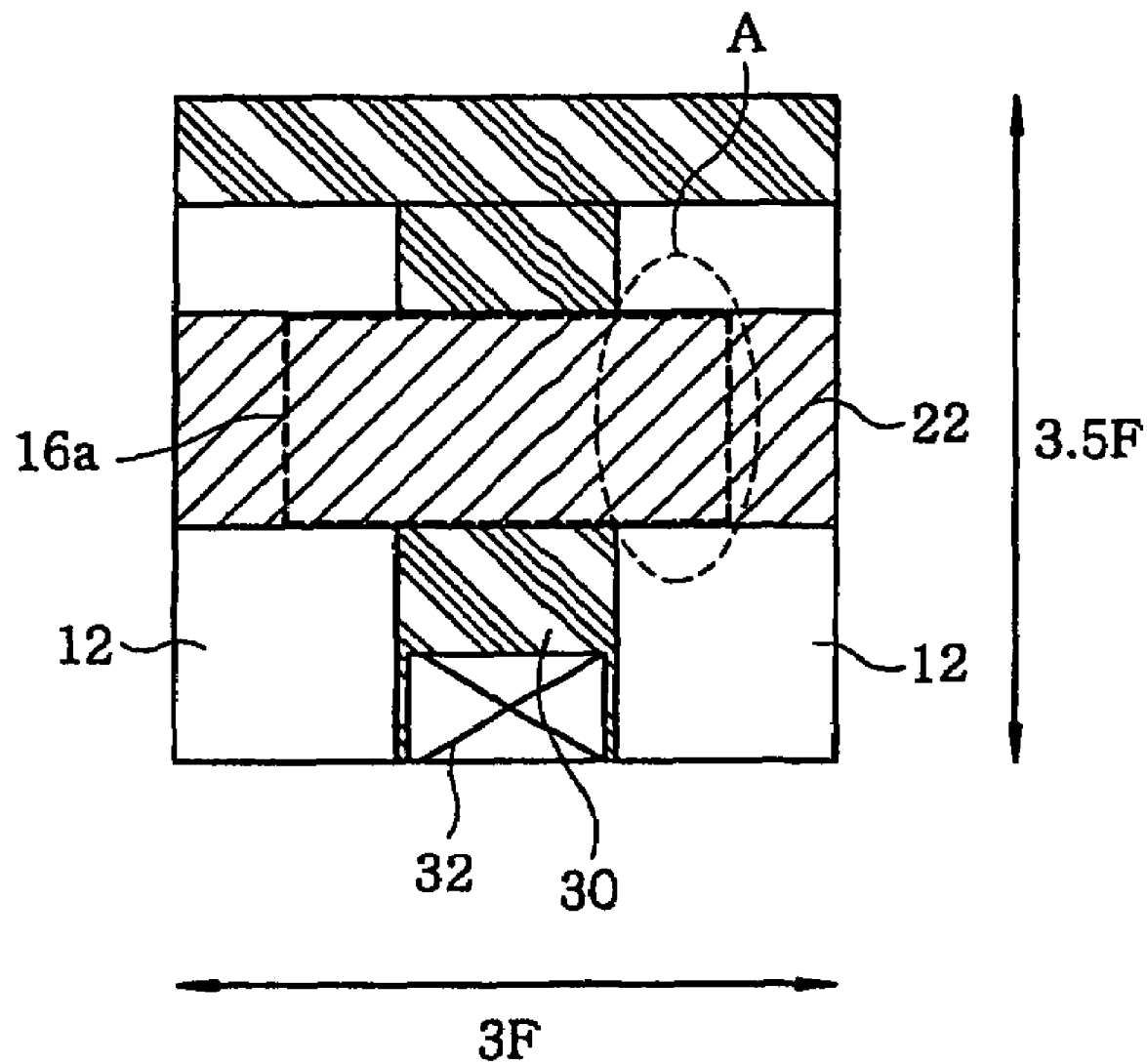
FIG. 1B is a plan view showing a unit cell of a conventional flash memory device.
Figure 4A:
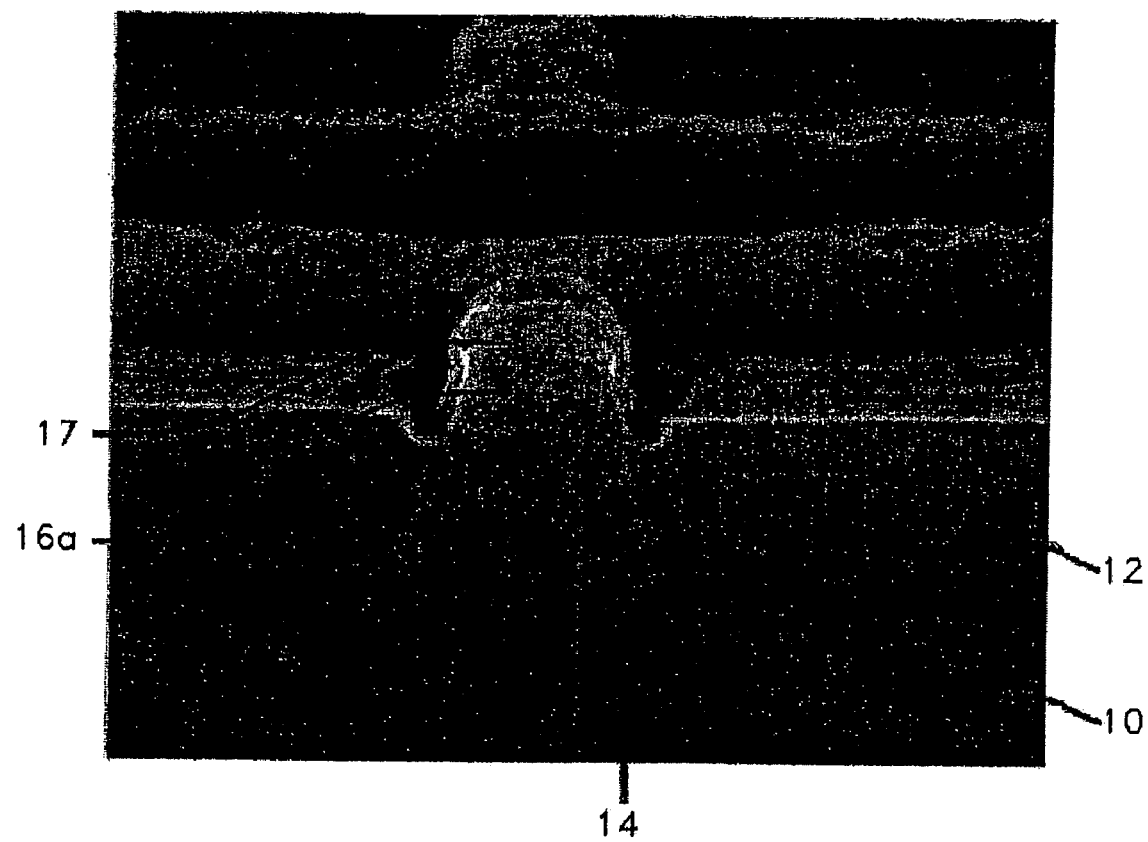
FIG. 4A, obtained using a scanning electron microscopy, is a view showing an image of the shape of the section of a floating gate formed according to the present invention.
Figure 4B:
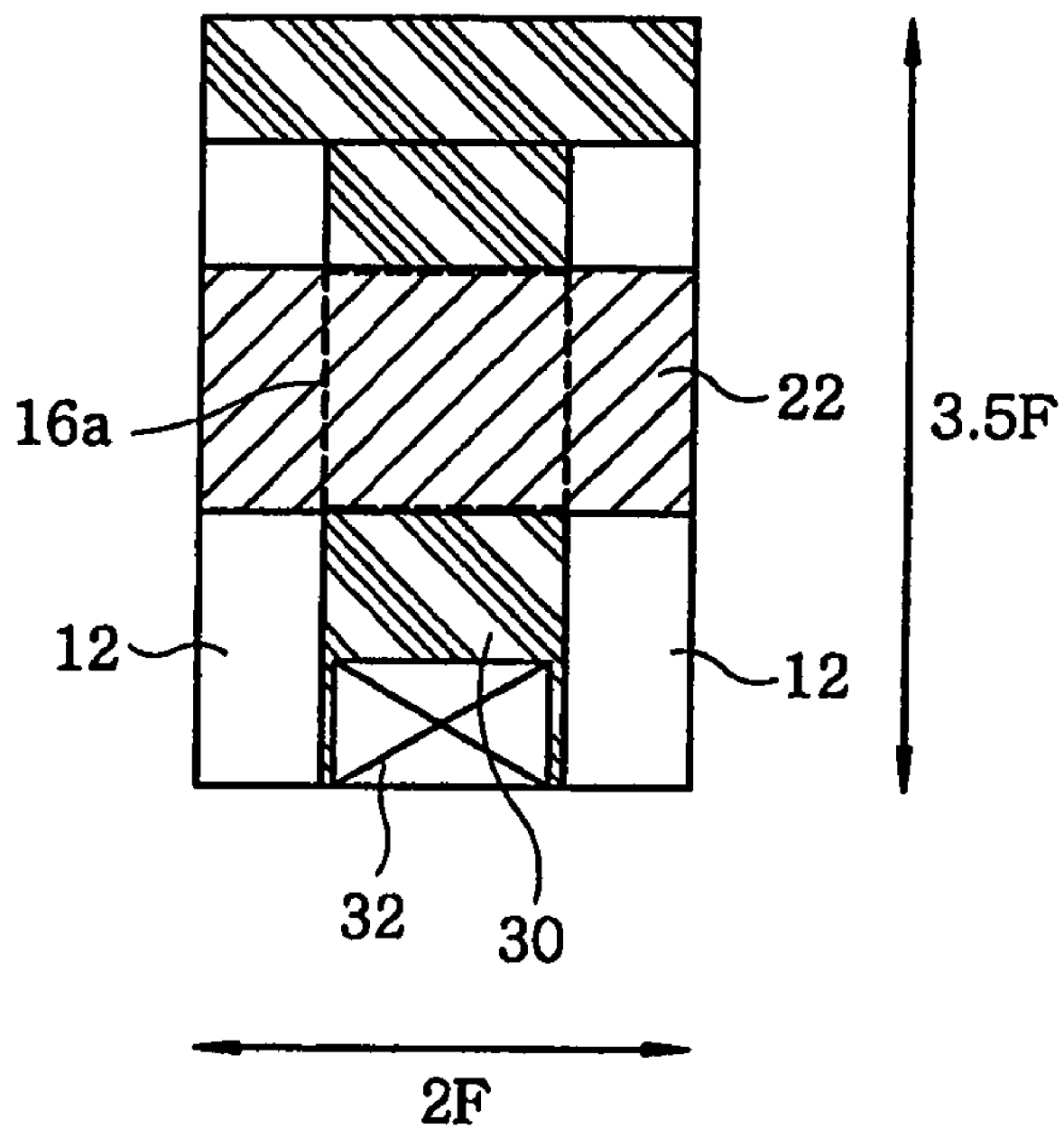
FIG. 4B is a plan view showing a unit cell of a flash memory device, formed according to the present invention.

The plan view of the unit cell for the flash memory device, formed in this way, is shown in FIG. 4B. The unit cell of FIG. 4B has an area of about $7F^2$ because the side walls of the floating gates 16a are aligned with the side walls of the device isolations 12. Therefore, if the area of the unit cell for the flash memory device according to the present invention is compared to that of the unit cell of a flash memory device formed according to a conventional method (about $10.5 F^2$, refer to FIG. 1B), the area can be reduced by about 66.7%.

Second Embodiment

Figure 3A:
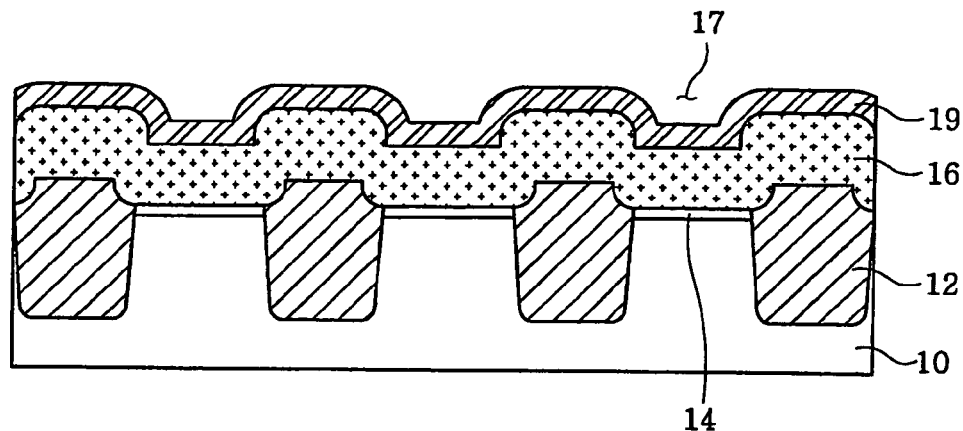
FIGS. 3A to 3C are sectional views sequentially showing a method of forming a floating gate array according to another embodiment of the present invention.
Figure 3B:
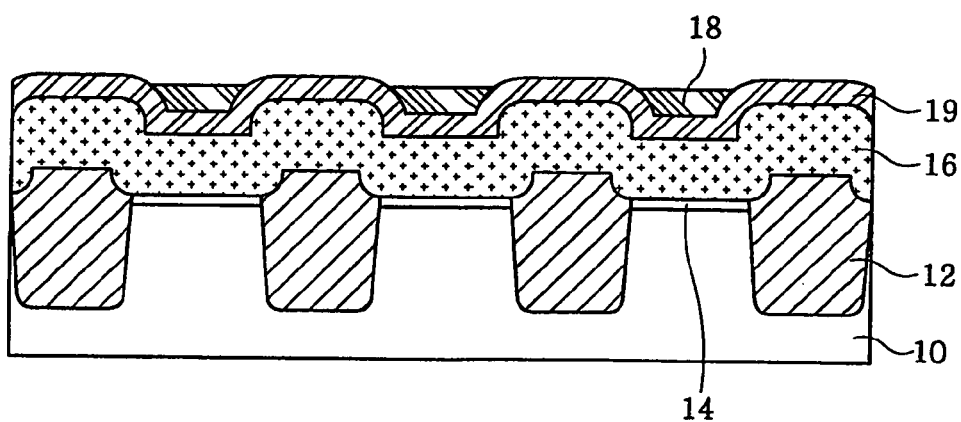
Figure 3C:
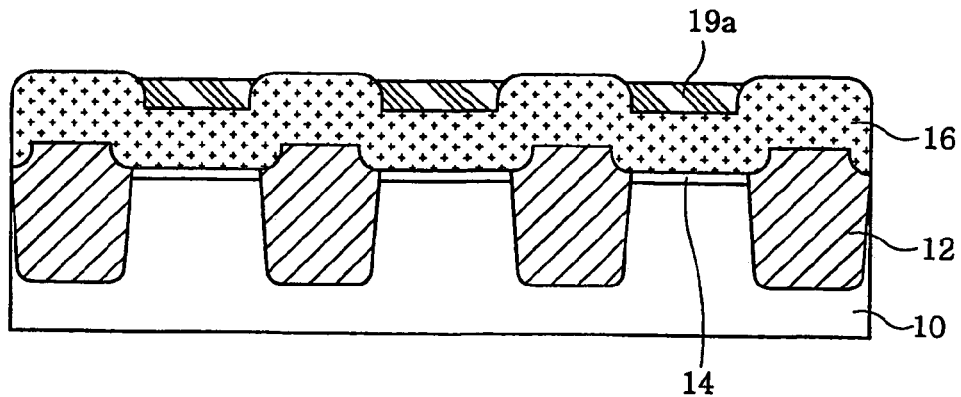

Next, with reference to FIGS. 3A to 3C, a second embodiment of the present invention is described. FIGS. 3A to 3C illustrate the vertical section of a flash memory device parallel to a word line.

In the second embodiment, the process for forming device isolations 12, tunnel oxide layers 14, and a floating gate-forming layer 16 is similar to that of the first embodiment, so a detailed description thereof is omitted. In the second embodiment, the floating gate-forming layer 16 is formed along the morphology of a substrate 10, thus grooves 17 are formed along active device regions.

Referring to FIG. 3A, after the floating gate-forming layer 16 is formed, a hard mask layer 19, for maintaining grooves 17 unchanged, is thinly formed. The hard mask layer 19 can be made of a silicon oxide layer or a silicon nitride layer, or a dual layer composed of an oxide layer/nitride layer. The reason for additionally forming the hard mask layer 19 is that masking materials 18 in the grooves 17 may be gradually consumed by plasma during a process for etching the floating gate-forming layer 16 formed beneath the materials 18 in the first embodiment. If the masking materials 18 are completely consumed before the completion of patterning, the floating gate pattern cannot be completed.

Next, as shown in FIG. 3B, the grooves 17 on the hard mask layer 19 are filled with masking materials 18. For the masking materials, any one of a material for an anti-reflective layer, a photo resist and a Spin On Glass (SOG) oxide can be used. The process for filling the grooves with the masking materials is similar to that of the first embodiment. In this case, the hard mask layer 19 is formed such that the grooves 17 can be approximately maintained, without change, along the morphology of the floating gate-forming layer 16 formed beneath the hard mask layer 19. Therefore, even though the grooves 17 are filled with masking materials, the boundaries of the grooves 17 can be formed to be approximately aligned with the side walls of the device isolations 12, as in the case of the first embodiment.

Since the hard mask layer 19 is thinly formed, there is a low probability that the masking materials 18 formed on the hard mask layer 19 will be completely consumed during the patterning of the hard mask layer 19, even though the amount of the masking materials 18 is small. Therefore, the hard mask layer 19 can be safely patterned through an etching process, using the masking materials 18 as an etching mask (refer to FIG. 3C).

Next, since patterned hard mask layers 19a will be formed such that the interfaces thereof are approximately aligned with the side walls of the device isolations 12, floating gates 16a having the same structure as seen in FIG. 2B are formed if the floating gate-forming layer 16 is patterned using the patterned hard mask layers 19a.

FIG. 4A illustrates a Scanning Electron Microscopy (SEM) image obtained by observing the floating gate of a unit cell formed using the hard mask layer 19 and the masking materials 18. As shown in FIG. 4A, the side walls of a floating gate 16a are aligned with the side walls of the device isolations 12. Further, the unit cell formed according to the second embodiment also has a reduced area, as shown in FIG. 4B.

Accordingly, the present invention is advantageous in that it can reduce the area of a unit cell almost as much as a conventional SA-STI process, and in that it can obtain a floating gate array, in which both side walls of each floating gate are self-aligned with device isolations, through a process simpler than the conventional SA-STI process. The method of forming the self-aligned floating gate array according to the present invention can be applied to every cell structure regardless of whether it is a NOR-type or NAND-type cell structure.

While the invention has been shown and described with respect to the preferred embodiments, it will be understood by those skilled in the art that various changes and modifications may be made without departing from the spirit and scope of the invention as defined in the following claims. Therefore, the embodiments described herein should be considered to be descriptive, rather than restrictive. The scope of the present invention is defined by the accompanying claims rather than the detailed description, and all variations that fall within the range set forth in the claims should be interpreted as being included in the present invention.

What is claimed is:

1. A method of forming a floating gate array of a flash memory device, comprising:
    (a) forming a plurality of device isolations, which define active device regions, in a semiconductor substrate, the device isolations being formed such that upper portions thereof protrude from a surface of the substrate by a predetermined height;
    (b) forming tunnel oxide layers in the active device regions;
    (c) forming a floating gate-forming layer throughout an entire region of the substrate, including regions in which the plurality of device isolations and the active device regions are formed, the floating gate-forming layer being formed such that grooves are formed along the active device regions;
    (d) forming a hard mask layer on the floating gate-forming layer to maintain the grooves that are formed along the active device regions;
    (e) filling only the grooved portions formed on the hard mask layer with masking materials;
    (f) patterning the hard mask layer, using the masking materials filling the grooves as an etching mask; and
    (g) patterning the floating gate-forming layer using the patterned hard mask layer as an etching mask.

2. The method of claim 1, wherein the floating gate-forming layer is a polycrystalline silicon layer doped with impurities.

3. The method of claim 1, wherein the hard mask layer is made of any one of an oxide layer and a nitride layer.

4. The method of claim 1, wherein the masking materials are implemented using any one of a material for an anti-reflective layer, a photo resist and a Spin On Glass (SOG) oxide.

* * * * *